United States Patent [19]
Bessho et al.

[11] Patent Number: 6,097,648
[45] Date of Patent: Aug. 1, 2000

[54] SEMICONDUCTOR MEMORY DEVICE HAVING PLURALITY OF EQUALIZER CONTROL LINE DRIVERS

[75] Inventors: Shinji Bessho; Shunichi Sukegawa, both of Plano; Masayuki Hira, Dallas, all of Tex.; Yasushi Takahashi, Urawa, Japan; Tsutomu Takahashi, Tachikawa, Japan; Koji Arai, Kodaira, Japan

[73] Assignees: Texas Instruments Incorporated, Dallas, Tex.; Hitachi, Ltd., Tokyo, Japan

[21] Appl. No.: 09/066,579

[22] Filed: Apr. 24, 1998

[30] Foreign Application Priority Data

Apr. 24, 1997 [JP] Japan ..................... 9-121783

[51] Int. Cl.$^7$ ..................................... G11C 7/00
[52] U.S. Cl. ..................... 365/203; 365/230.06
[58] Field of Search ..................... 365/203, 205, 365/230.03, 230.06, 189.05

[56] References Cited

U.S. PATENT DOCUMENTS 5,068,831  11/1991  Hoshi et al. ..................... 365/203
5,623,446   4/1997  Hisada et al. ..................... 365/189.11

*Primary Examiner*—David Nelms
*Assistant Examiner*—David Lam
*Attorney, Agent, or Firm*—Frederick J. Telecky, Jr.; William B. Kempler

[57] ABSTRACT

An equalizer control line BLEQ shared by all sense amplifiers SA in each row in each submat SM is connected to a first equalizer control line driver consisting of P-type MOS transistors installed at the left end of the submat SM and is connected to several second equalizer control line drivers 32 consisting of N-type MOS transistors installed by dividing in a cross area 16 of each row through which the equalizer control line BLEQ passes. In order to turn on the equalizers of the bit line pair connected to each sense amplifier S, the first equalizer control line driver is operated to drive the equalizer control line BLEQ to the H level potential. In order to turn off the equalizers of each bit line pair, the second equalizer control line drivers 32 are operated to drive the equalizer control line BLEQ to the L level potential. The first and second equalizer control line drivers are complementarily operated. One of them is driven, and the other is turned off (blocked).

8 Claims, 6 Drawing Sheets

SEMICONDUCTOR MEMORY DEVICE HAVING PLURALITY OF EQUALIZER CONTROL LINE DRIVERS

FIELD OF THE INVENTION

The present invention pertains to a semiconductor memory device and in particular, pertains to a memory device such as a DRAM (Dynamic Random Access Memory).

BACKGROUND OF THE INVENTION

In general, in a memory array of the DRAM, as shown in FIG. 8, one memory cell MCij is connected at the intersection point of a bit line BLi (or complementary bit line BLi—) installed on each row (or column) and a word line WLj installed on each column (or row). Each memory cell MCij consists of one N-type MOS transistor TRij and one capacitor Cij. Each word line WLj is connected to a word line driver WDj for of each column, and each bit line BLi (complementary bit line BLi—) is connected to a sense amplifier SAi for each row. Also, the structure of part of the memory array show in FIG. 8 is simplified and shown in the figure to make the explanation easy.

In the sense amplifier SAi, a pair of N-type MOS transistors TR1 and TR2 constitute a transfer gate for conditionally connecting the bit line pairs BLi and BLi— to the sense amplifier SAi. Three N-type MOS transistors TR3, TR4, and T5 constitute a precharge circuit for precharging the bit line pair BLi and BLi— to a prescribed potential, for example, an intermediate power supply voltage potential (Vcc/2). A pair of P-type MOS transistors TR6 and TR7 and a pair of N-type MOS transistors TR8 and TR9 constitute an amplifying circuit for respectively amplifying presense voltages on the bit line pair to prescribed levels. One pair of N-type MOS transistors TR10 and TR11 constitute a transfer gate for conditionally connecting the bit line pair BLi and BLi— to data input and output line pair IO and IO—.

FIG. 9 explains the writing or reading of data into and from the memory cell MCij in the memory cell. In a standby state before reading and writing, an equalizer control signal φE is at H level, and any of the N-type MOS transistors TR3, TR4, and TR5 of the precharge circuit is turned on. On the other hand, a precharge feeder VBLR supplies a voltage of Vcc/2 level. Thus, the bit line BLi and the complementary bit line BLi— is precharged in an equalized (equilibrated or short-circuited) state to Vcc/2 level.

If an external row address strobe signal RAS__ falls to L level for reading or writing, the equalizer control signal φE falls to L level in response to it, and any of the transistors TR3, TR4, and TR5 of the precharge circuit are turned off.

Next, the word line WLj of a selected column is activated by the word line driver WDj, and the potential information (storage information) of the memory cell MCi,j connected to the word line WLj is read out on one of the bit line pairs, for example, on the bit line BLi, so that the potential of the bit line BLi is changed. In the example of FIG. 9, the potential information is "0," and the potential of the bit line BLi is slightly changed downward from the Vcc/2 level.

Next, one sense amplifier driving line SDN is pulled down to a ground potential Vss, and the other sense amplifier driving line SDP is pulled up to a power supply voltage Vcc.

In this example, since the potential of the bit line BLi is changed downward from the Vcc/2 level, the P-type MOS transistor TR7 is turned on. Thus, the complementary bit line BLi— is connected to the sense amplifier driving line SDP via the transistor TR7, and the complementary bit line BLi— is pulled up to the power supply voltage Vcc. On the other hand, the transistor TR7 is turned on, and the voltage of the complementary bit line BLi— is raised, so that the N-type MOS transistor TR8 is turned on. The bit line BLi is connected to the sense amplifier driving line SDN via the transistor TR8 turned on, and the bit line Bli is pulled down to the ground potential Vss.

Next, if a Y address line YSi is activated by a Y address decoder (not shown in the figure), the transfer gates TR10 and TR11 are turned on, and the bit line BLi and the complementary bit line BLi— are respectively connected to the data input and output line IO and the complementary data input and output line IO—.

Thus, when reading, the data read out to the bit line BLi from the memory cell MCi,j is sent onto the data input and output line IO via the transfer gates T1[sic; TR1] and TR10. When writing, the data on the data input and output line IO is sent to the bit line BLi via the transfer gates TR10 and TR1 and written into said memory cell (memory cell at the intersecting point of the bit line BLi and the word line WLj).

On the other hand, for example, in a large-scale DRAM such as the 64 Mb class, the memory array in one chip is divided into several blocks or submats, and the memory array constitution, in which the memory array is divided into several unit memory arrays, is adopted in each submat.

In each submat, a fixed number of unit memory arrays is arranged in a matrix form at a fixed interval. Then, a set circuit (word line driver bank) of the word line driver WD is arranged in the vicinity of each unit memory cell, for example, at both the left and right sides so that they face each other. Therefore, a fixed number of unit memory arrays is arranged in one column at a fixed interval in the left and right directions, and the sense amplifier banks corresponding to each unit memory array are arranged in one column at a fixed interval.

One equalizer control line BLEQ for supplying the equalizer control signal φE is allocated to the sense amplifier bank of each column or each row arranged in one column. Each equalizer control line BLEQ is extended so that it crosses horizontally or vertically in the submat from the output terminal of an equalizer control line driver arranged at one end of the submat, distributed via an interlayer insulating film on the sense amplifier bank of each row or each column, and connected via a contact hole to all the sense amplifiers SAi in the sense amplifier bank of each row or each column.

FIG. 10 shows a circuit constitution of the equalizer control line driver used in such a conventional DRAM. The equalizer control line driver consists of a CMOS inverter, and the output terminal is connected to the equalizer control line BLEQ. The input terminal receives a timing signal φA for controlling the equalizer from an array controller (not shown in the figure).

When the equalizer timing signal φA is at the L level, the P-type MOS transistor MP is turned on, and the N-type MOS transistor MN is turned off. The equalizer control line BLEQ is connected to a power supply voltage terminal with a prescribed voltage VDD (for example, 2.9 V) at the H level via the P-type MOS transistor MP in the on state. Thus, the equalizer control signal φE is held at the H level. In each sense amplifier SAi connected to the equalizer control line BLEQ, each N-type transistor TR3, TR4, and TR5 of the precharge circuit is electrified, and the equalizer of the bit line pair BLi and BLi— is turned on (activated state).

If the equalizer timing signal φA is at the H level, the N-type MOS transistor MN is turned on, and the P-type MOS transistor MP is turned off. The equalizer control line BLEQ is connected to the power supply voltage terminal of the ground voltage Vss via the N-type MOS transistor MN in the on state. Thus, the equalizer control signal φE falls to the L level, and in each sense amplifier SAi connected to the equalizer control line BLEQ, each N-type transistor TR3, TR4, and TR5 of the precharge circuit is blocked, so that the equalizer of the bit line pair BLi and BLi— is turned off. Thereby, a sensing operation is enabled by the amplifying transistors TR6–TR9.

As mentioned above, in such a of DRAM, as a rule, after lowering the row address strobe signal RAS_ to the L level, first, the equalizer of the bit line pair BLi and BLi— is turned off (disabled) by lowering the equalizer control signal φE to the L level, and the selected word line WLj is then activated.

In the procedure, if the timing for activating the word line WL is accelerated, the memory access time (time from the fall of RAS_ to the data input and output) can be shortened, so that the memory access speed can be improved.

However, even in case the word line WL is raised at a fast timing, the equalizer control signal φE must be lowered to the L level at a speed faster than that. Since both a timing signal for starting the rise of the word line WL and a timing signal for starting the fall of the equalizer control signal φE are generated from a common address decoding signal, there is a limitation in accelerating the timing for starting the fall of the equalizer control signal φE.

Therefore, in order to fit the timing of the equalizer control signal φE to the early activation of the word line WL, the rise speed of the equalizer control signal φE or equalizer control line BLEQ must be improved.

On the other hand, as mentioned above, each equalizer control signal BLEQ is commonly connected to the precharge circuit (TR3, TR4, and TR5) of all the sense amplifiers belonging to several sense amplifier banks on each column or each row in the submat. For this reason, the wiring resistance or wiring capacity of the equalizer control line BLEQ itself is large, and the input gate capacity in the precharge circuit (TR3, TR4, and TR5) is also large, so that the load capacity of the equalizer control line BLEQ is very large.

However, since the conventional DRAM is a system that drives such an equalizer control line BLEQ with a very large load capacity from one end of the submat by the above-mentioned CMOS inverter type equalizer control line driver (FIG. 10), it is difficult to accelerate the fall rate of the equalizer control signal φE. In particular, the larger the separation from the equalizer control line driver, the higher the increase of the delay in the equalizer control line BLEQ, and the slower the fall rate of the equalizer control signal φE.

For this reason, if the activation timing of the word line WL is accelerated, as shown in FIG. 11, a cross point CP, at which the potential of the equalizer control line BLEQ (equalizer control signal φE) and the potential of the word line WL intersect, is inevitably raised, and the word line W is raised up to the level of a threshold or higher while BLEQ (φE) is still higher than the threshold of the precharge circuit (TR3, TR4, and TR5), so that a sensing sufficiency is generated through the precharge circuit, or data in the memory cell is likely to be damaged.

Thus, in the conventional DRAM, since the fall of the equalizer control signal φ is slow, if the activation timing of the word line is raised, inconveniences such as sensing insufficiency are likely to occur. For this reason, the improvement of the memory access speed is difficult.

The present invention considers these problems, and its objective is to provide a semiconductor memory device that greatly shortens the required time for turning off a bit line equalizer and can speed up the memory access time.

SUMMARY OF INVENTION

In order to achieve the above-mentioned purpose, a first semiconductor memory device of the present invention is characterized by: having several unit memory arrays discretely arranged in a prescribed arrangement pattern on one semiconductor substrate, in which several sense amplifiers connected to a pair of complementary bit lines in the above-mentioned unit memory arrays are arranged in the vicinity of each above-mentioned unit memory array, and in which an equalizer control line for controlling an equalizer of the potential of each above-mentioned bit line pair is commonly connected to the above-mentioned several sense amplifiers over the above-mentioned several unit arrays; having first driving circuit for driving the above-mentioned equalizer control line at a first voltage level to turn on the equalizer of the above-mentioned bit line pairs and a second driving circuit for driving the above-mentioned equalizer control line at a second voltage level to turn off the equalizer of the above-mentioned bit line pairs; the above-mentioned second driving circuit being divided into several and electrically connected to several positions of the above-mentioned equalizer control lines.

Also, a second semiconductor memory device of the present invention is characterized by the fact that the above-mentioned several sense amplifiers arranged in the vicinity of each above-mentioned unit memory array are arranged in prescribed bank regions and that the above-mentioned second driving circuit is installed between the above-mentioned several mutually adjacent sense amplifier bank regions.

Also, a third semiconductor memory device of the present invention is characterized by the fact that the above-mentioned first driving circuit has a first terminal connected the above-mentioned equalizer control line, a second terminal connected to a power supply voltage terminal for giving the above-mentioned first potential level, a control terminal for inputting a binary signal which determines the voltage level of the above-mentioned equalizer control line, and a first electroconductive transistor in which an electrified state is formed between the above-mentioned first and second terminals according to a first logic state of the above-mentioned binary signal and in which the above-mentioned first and second terminals are blocked according to a second logic state of the above-mentioned binary signal and that the above-mentioned second driving circuit has a first terminal connected to the above-mentioned equalizer control line, a second terminal connected to a power supply voltage terminal for giving the above-mentioned second potential level, a control terminal for inputting the above-mentioned binary signal, and a second electroconductive transistor in which the above-mentioned first and second terminals are blocked according to the first logic state of the above-mentioned binary signal and in which an electrified state is formed between the above-mentioned first and second terminals according to the second logic state of the above-mentioned binary signal.

10 is an array controller, 12 is a sense amplifier bank, 14 is a subword line drive bank, 16 is a cross area, 30 is the first equalizer control line driver, 32 is the second equalizer control line driver, SM is a submat, Um is a unit memory array, BLEQ is Equalizer control line and SA is a sense amplifier

DESCRIPTION OF EMBODIMENTS

Next, referring to FIGS. 1–7, the application examples of the present invention are explained.

Figure 1:
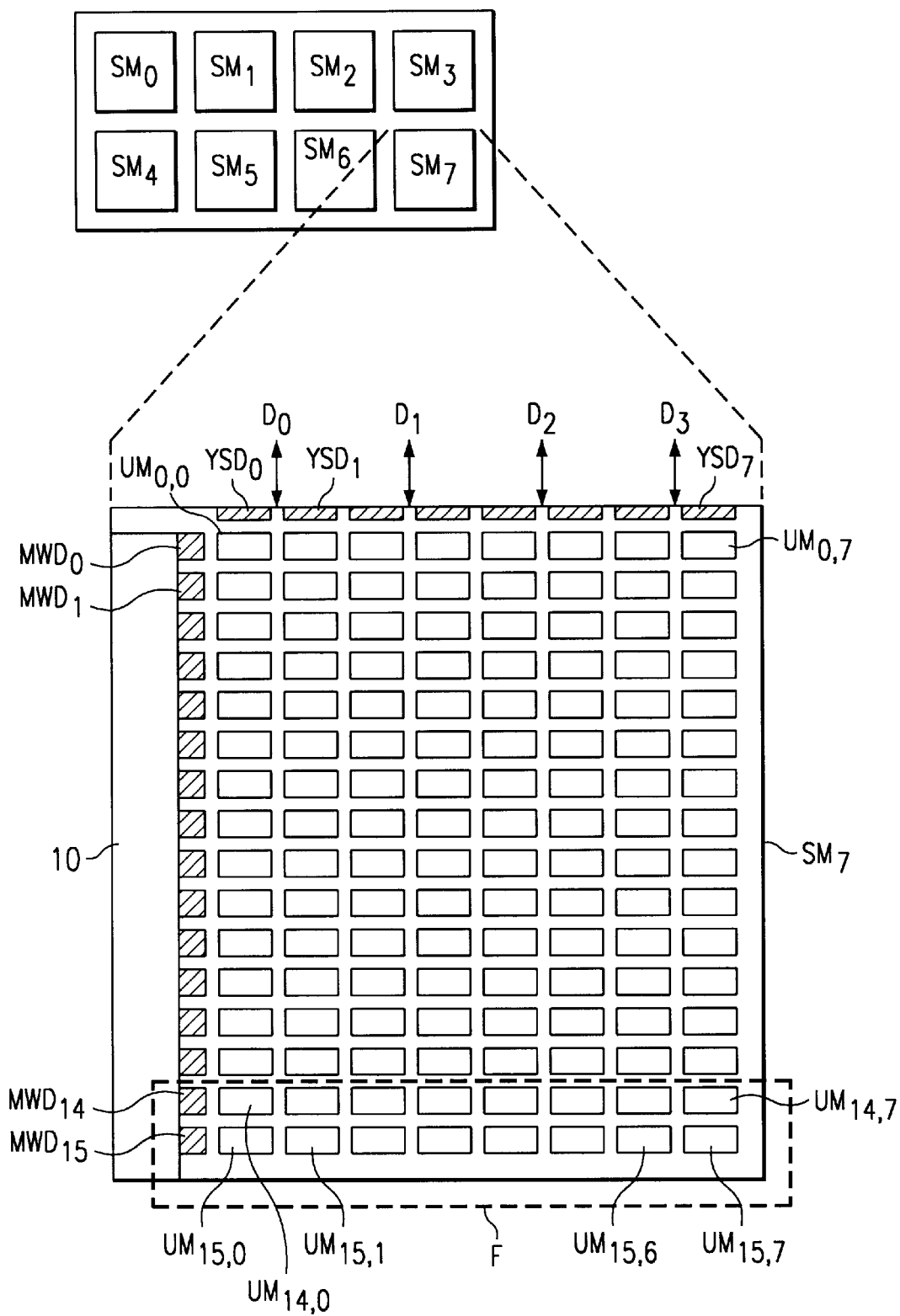
FIG. 1 shows a memory array constitution in a DRAM in an application example of the present invention.

FIG. 1 shows a memory array constitution in a DRAM in an application example of the present invention. The DRAM has a storage capacity of 64 Mb, for instance, and a memory array (64 Mb) in one chip (semiconductor substrate) is divided into eight 8-Mb blocks or submats SM, and the memory array (8 Mb) in each submat SM is divided into 128 parts of 64-Kb arrays or unit memory arrays UM.

In each submat SM, 128 parts of unit memory arrays UM are discretely arranged at a fixed interval in a matrix pattern of 16 rows×8 columns. At the left end of each submat SM, an array controller 10 is arranged, and a main word line driver MWD for each row is arranged in one column in the vertical direction inside the controller 10. Also, at the upper end of each submat SM, a YS driver YSD for selectively driving a Y address line YS in each column is arranged in one column in the horizontal direction.

Figure 2:
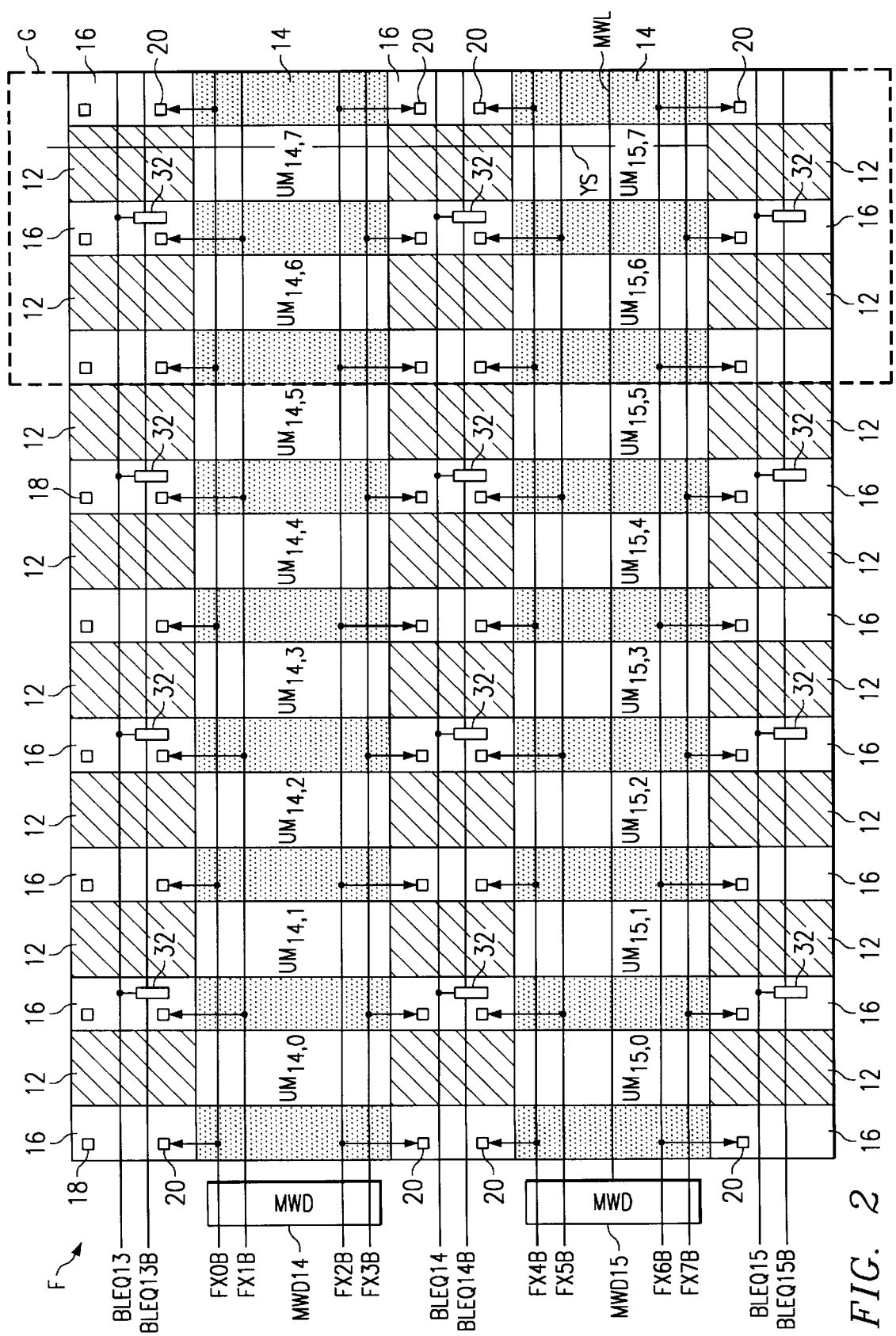
FIG. 2 is a partially enlarged diagram showing the part enclosed with a dotted line F of FIG. 1.
Figure 3:
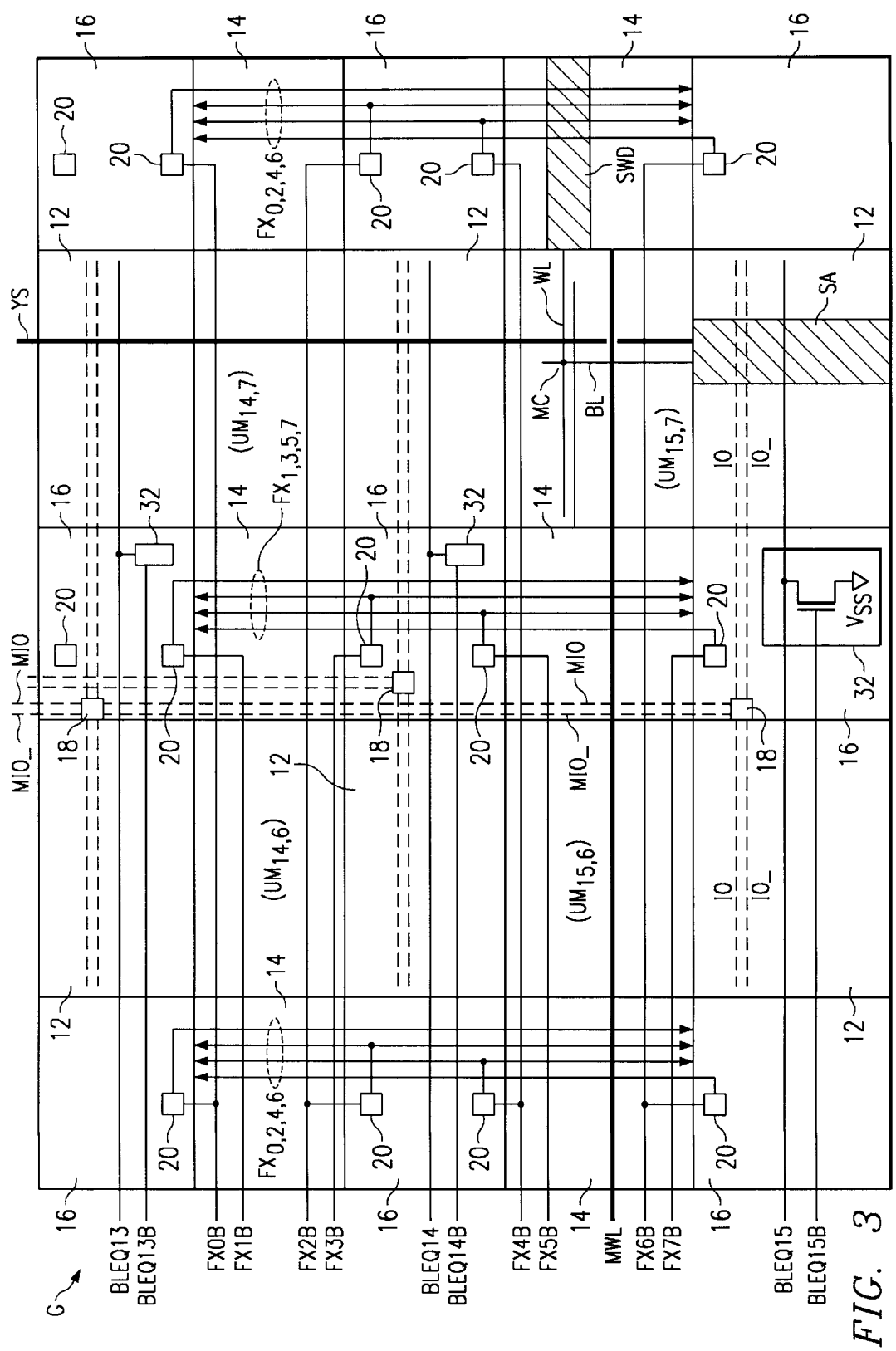
FIG. 3 is a partially enlarged diagram showing the part enclosed with a dotted line G of FIG. 2.

FIG. 2 is an enlarged diagram showing the part enclosed with a dotted line F of FIG. 1. Furthermore, FIG. 3 is an enlarged diagram showing the part enclosed with a dotted line G of FIG. 2.

In each unit memory array UM, for example, 256 sets (rows) of bit line pairs and 256 parts (columns) of subword lines are distributed in a matrix form, and the memory cell is connected at the intersecting point of each word line WL and each bit line BL. Also, in this example, no memory cell is not connected at the intersecting point of each word line WL and each complementary bit line BL—.

A pair of sense amplifier banks 12 and 12 are arranged at both the upper and lower sides in the vicinity of each unit memory array UM so that they face each other, and a pair of subword line driver banks 14 and 14 are arranged at the left and right sides so that they face each other. Also, a cross area 16 is installed at each side of each unit memory array.

In the subword line driver banks 14 and 14 at both the left and right sides, 128 parts of subword line drivers SWD are arranged in a zigzag shape. Among 256 parts of subword lines WL in the unit memory array UM, for example, the odd subword lines WL of a half (128 parts) of the subword lines are respectively connected to 128 parts of subword line drivers SWD in the left subword line driver bank 14, and the even subword lines WL of the other half (128 parts) are respectively connected to 128 parts of subword line drives SWD in the right subword line driver bank 14.

Figure 4:
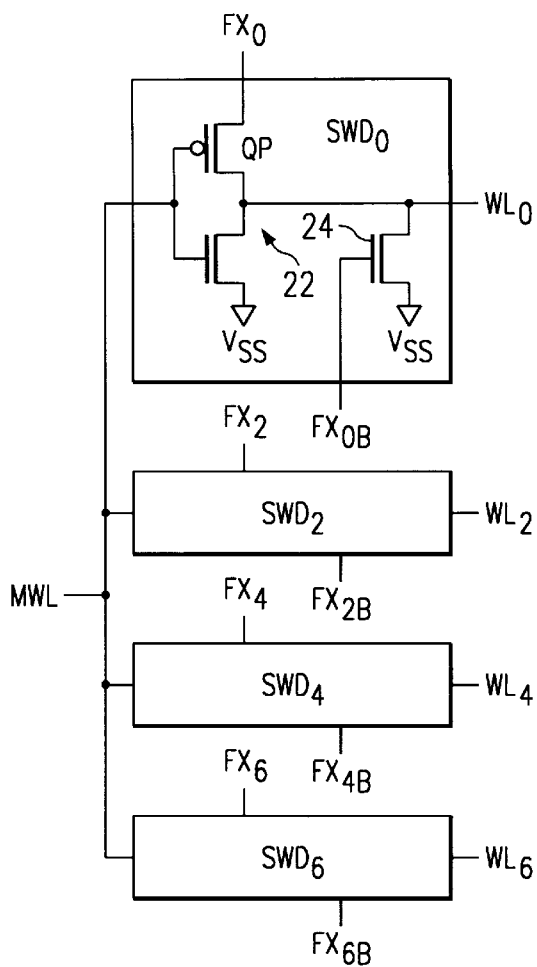
FIG. 4 is a circuit diagram showing a circuit constitution of a subword line driver in the DRAM of the application example.

From the main word line driver MWD of each row, 32 parts of main word lines MWL cross in the horizontal direction through the top of the unit memory arrays UM, UM, etc., and the subword line drive banks 14, 14, etc., of each row. Then, as shown in FIG. 4, each main word line MWL is connected to 4 parts of subword line drives such as (SWD0, SWD2, SWD4, and SWD6) in each subword line driver bank 14.

Also, from a main FX driver (not shown in the figure) installed in the array controller 10 of the left end of the submat SM, 8 parts of transistor driving lines (FX0B–FX7B) cross in the horizontal direction through the top of the unit memory arrays UM, UM, etc., of each row at a unit of two rows and are connected to the corresponding ones in several sub FX drivers 20 arranged by dividing the cross area 16 as shown in FIG. 3.

This one set (8 parts) of transistor driving lines (FX0B–FX7B) function to selectively operate the subword line driver SWD of one of the subword line driver banks 14 and 14 of both sides of each unit memory array UM in corporation with said main word line MWL.

Figure 5:
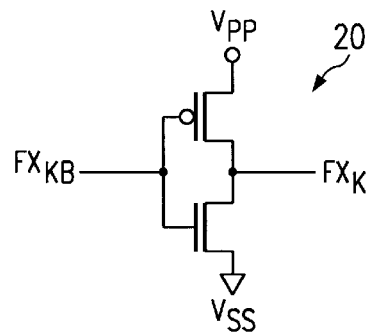
FIG. 5 is a circuit diagram showing a circuit constitution of a sub FX driver in the DRAM of the application example.

As shown in FIG. 5, the sub FX driver 20 consists of the CMOS inverter, for instance, and inverts the logic state of an input transistor driving signal FXKB. Then, when an H-level driving signal FXK is output, it is output at the level of a reference power supply voltage VPP for driving word lines.

In FIG. 4, each subword line driver SWD consists of one CMOS circuit 22 and one N-type MOS transistor 24. The main word line MWL is connected to the input terminal of the CMOS circuit 22, and the subword line WL is connected to the output terminal of the CMOS circuit 22. An output signal FX from the corresponding sub FX driver 20 is given to the source terminal of the P-type MOS transistor QP of the CMOS circuit 22. The corresponding transistor driving signal FXB from a main FEx driver (not shown in the figure) is given to the gate terminal of the N-type MOS transistor 24.

Therefore, in FIG. 4, when said main word line MWL is activated to the L level and one of the transistor driving signals (FX0B, FX2B, FX4B, and FX6B) is at the L level, the word line WL (WL2) in the subword line driver SWD (SWD2) corresponding to the transistor driving signal (for example FX2B) of the L level is activated to the H level.

Figure 8:
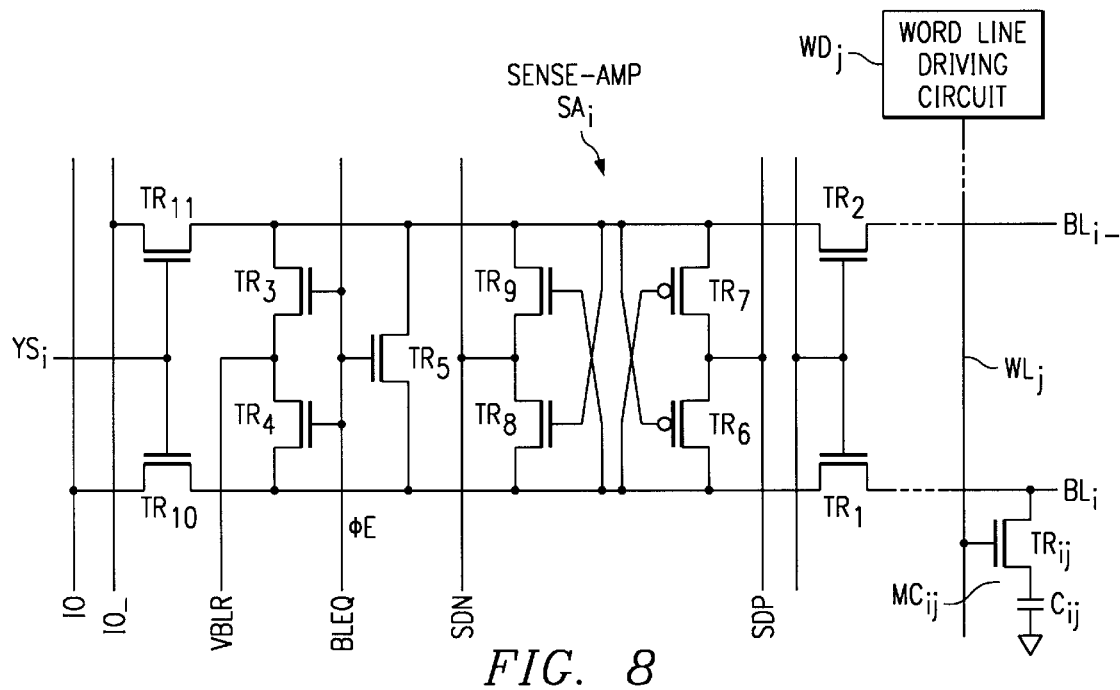
FIG. 8 shows a connection constitution of a typical memory cell in the DRAM and a circuit constitution of sense amplifiers.
Figure 10:
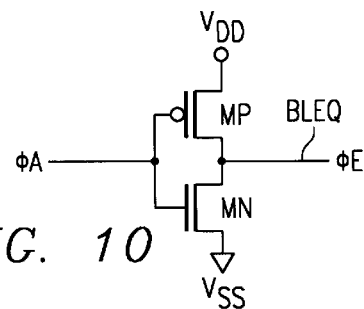
FIG. 10 is a circuit diagram showing a circuit constitution of equalizer control line drivers of a conventional DRAM.

In FIGS. 2 and 3, in both the upper and lower sense amplifier banks 12 and 12 of each unit main array UM, 128 parts of sense amplifiers SA are respectively arranged in a zigzag shape. Among 256 sets of bit line pairs in the unit memory array UM, for example, in FIG. 8, the odd subword line pairs of one-half (128 sets) of the subword lines are respectively connected to 128 parts of sense amplifiers SA in the upper sense amplifier bank 12, and the even bit line pairs of the other half (128 sets) are respectively connected to 128 parts of sense amplifiers SA in the lower sense amplifier bank 12.

In this example, 4-bit data (D0–D3) are simultaneously (parallel) input and output into and from each submat SM by one memory access, and 1-bit data are written or read into and from the unit memory arrays (UM and UM) of two columns in each submat SM.

In FIG. 3, local data input and output line and complementary data input and output line (IO and IO—) respectively connected to the sense amplifier SA in a pair of mutually adjacent sense amplifier bands 12 and 12 in the horizontal direction in the submat SM cross on each sense amplifier bank 12 and 12 and are connected to an IO switch 18 in the cross area 16. The main data input and output line and complementary data input and output line (MIO and MIO—) extending in the vertical direction through the top of the subword line driver bank 14 and the cross area 16 in the submat SM are also connected to the IO switch 18.

Thus, the sense amplifier SA selected by a Y select line YS is connected to an external data line of the submat SM at one side of a pair of unit memory arrays (UM and UM), which are mutually adjacent in the horizontal direction, via the local data input and output line and complementary data input and output line (IO, IO—), IO switch 18, and main data input and output line and complementary data input and output line (MIO and MIO—).

In the submat SM, one equalizer control line BLEQ for supplying the equalizer control signal φE is allocated to 8 parts of sense amplifier banks 12, 12, etc., of each row in the submat SM. Each equalizer control line BLEQ crosses in the horizontal direction through the top of the sense amplifier bank 12 and the cross area 16 of each row in the submat SM from the output terminal of a first equalizer control line driver 30 (FIG. 6) installed at the main controller 10 of one end of the submat SM and is connected to all the sense amplifiers SA (more specifically, the gate terminal for each transistor TR3, TR4, and TR5 of the precharge circuit) in these sense amplifier banks.

Figure 6:
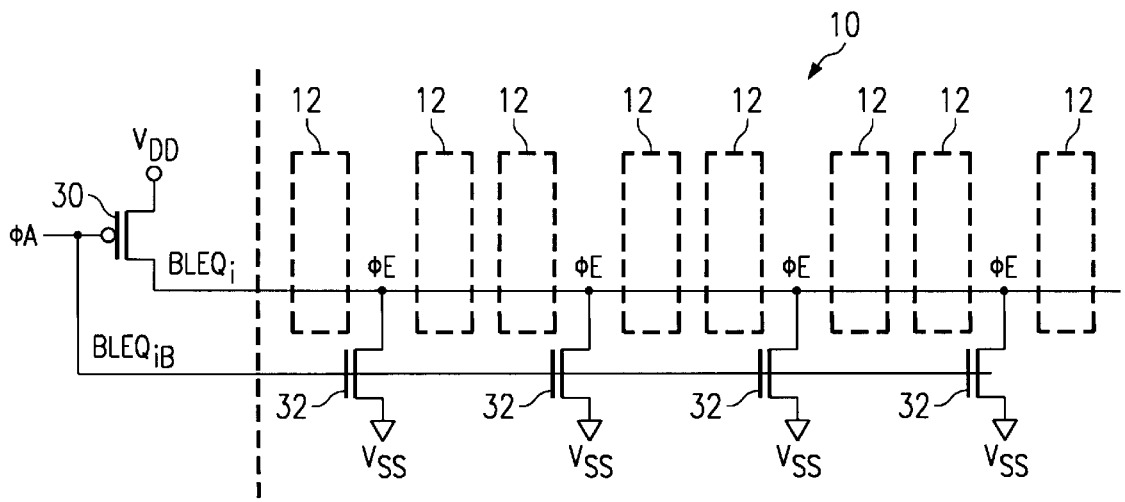
FIG. 6 shows a circuit constitution and an arrangement relationship between the first and second equalizer control line drivers connected to each equalizer control line BELQ in the DRAM of the application example.

As shown in FIG. 6, the first equalizer control line bank 30 consists of one P-type MOS transistor, for instance, and its drain terminal is connected to the equalizer control line BLEQi for each row. At the same time, its source terminal is connected to the terminal of the power supply voltage VDD, and the timing signal φA for an equalizer control generated in the array controller 10 is given to the gate terminal.

On the other hand, several (four) second equalizer control line drivers 32 are installed by dividing (for example, every other one as shown in the figure) in nine cross areas 16 of each row parallel with the equalizer control line BLEQ. Each second equalizer control line driver 32 consists of one N-type MOS transistor, for instance, and its drain terminal is connected to an equalizer control line BLEQi. At the same time, its source terminal is connected to the terminal of the ground potential Vss, and the timing signal φA for an equalizer control generated in the array controller 10 is given via a control line BLEQiB to the gate terminal.

Also, each equalizer control line BLEQ is distributed via an interlayer insulating film on the sense amplifier bank 12 and the cross area 16 of each row and connected to each sense amplifier SA in each sense amplifier bank 12 via a contact hole formed in said interlayer insulating film.

Also, in addition to the above-mentioned equalizer control line BLEQ or data input and output complementary data line/input and output line (IO and IO—), precharge feeder BLR, sense amplifier driving lines SDN, SDP, etc., are also connected to each sense amplifier according to an ordinary wiring technique.

The operation of the memory access in the DRAM of this application example is as follows.

In a standby state before memory accessing, in each submat SM, the equalizer timing signal φA generated by the array controller 10 is held at the L level. Thus, the P-type MOS transistor of the first equalizer control line driver 30 is in an electrified state, and each equalizer control line BELQ is maintained at the level of the power supply voltage VDD via the P type MOS transistor 30 in the electrified state. Therefore, the equalizer control signal φE on the equalizer control line BELQ is at the H level, and in all, the sense amplifiers SA in each sense amplifier bank 12, any of the N-type MOS transistors TR3, TR4, and TR5 of the precharge circuit is turned on. On the other hand, a voltage of the Vcc/2 level is supplied to each sense amplifier SA from the precharge feeder VBLR (not shown in the figure). Therefore, each bit line BLi and complementary bit line BLi— connected to each sense amplifier SA is precharged to the Vcc/2 level in an equalized (equilibrated or short-circuited) state.

If the external row address strobe signal RAS__ falls to the L level for reading or writing, the array controller 10 raises the equalizer timing signal φA to the H level in response to it. Thus, the P-type MOS transistor of the first equalizer control line driver 30 is blocked, and the N-type MOS transistor of the second equalizer control line driver 32 dispersed in the cross area 16 is electrified. Then, each equalizer control line BELQ is connected to the terminal of the ground potential Vss via the N-type MOS transistor in an electrified state of the second equalizer control line driver 32. Thus, electric charges on each equalizer control line BELQ are discharged to the ground potential Vss parallel in several cross areas 16 in which several second equalizer control line drivers 32 are divided, and the potential of the equalizer control signal φE is rapidly lowered down to the L level (Vss) at each part of the equalizer control line BELQ.

Figure 9:
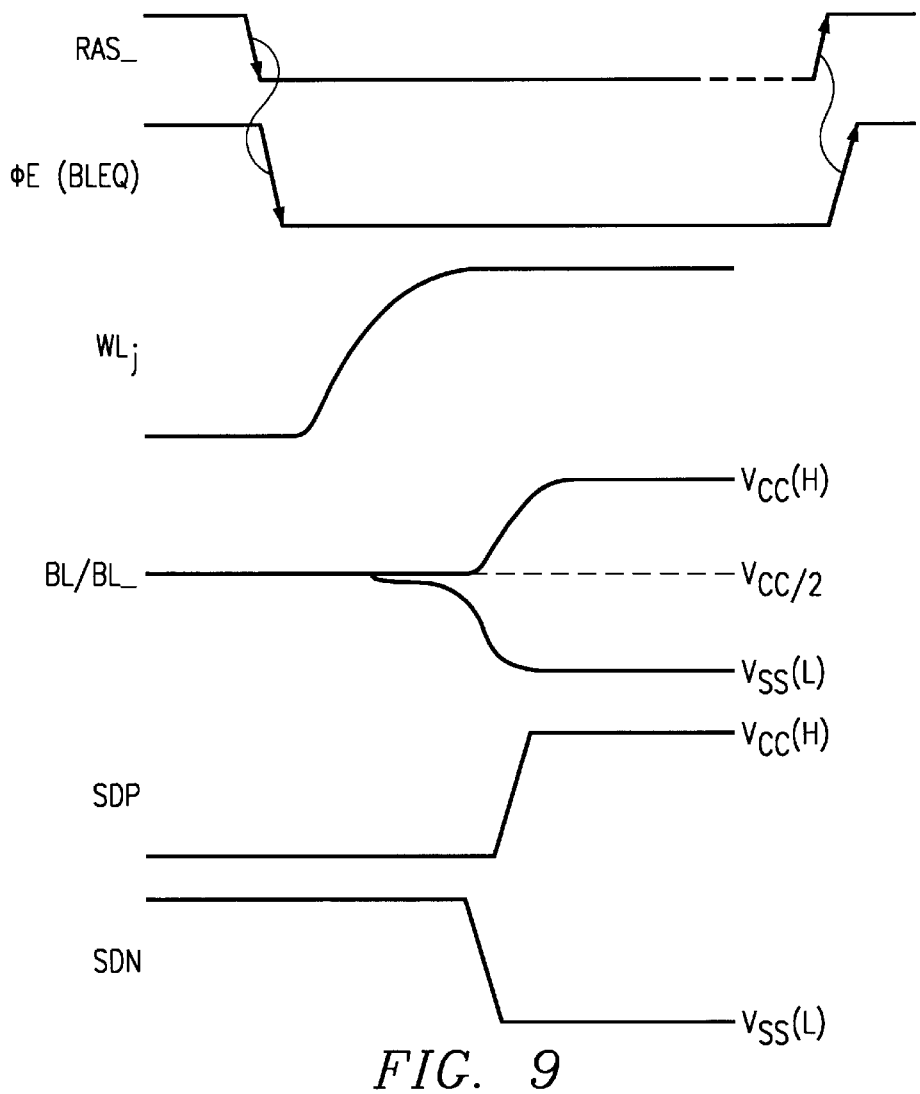
FIG. 9 shows a waveform of the signal of each part for explaining reading or writing in the DRAM.
Figure 11:
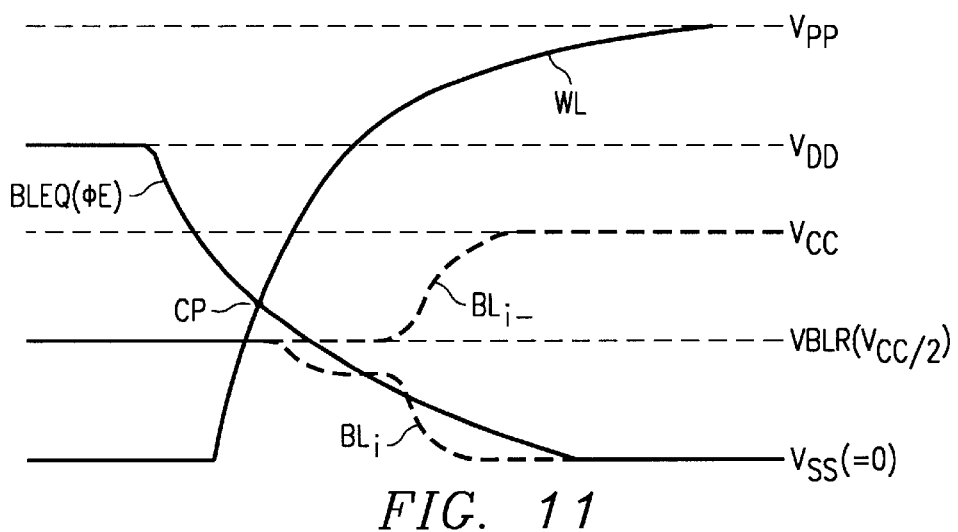
FIG. 11 shows a relationship between the fall in potential of the equalizer control lines and equalizer control signals and the rise in potential of the word lines in the conventional DRAM.

Next, one of the word lines WLj is activated in each selected unit memory array UM by the main word line driver MWD of the row selected by an address decoding signal, main FX driver, sub FX driver 18, and subword line driver SWD. Thus, the potential information (storage information) of the memory cell MCi,j connected to the subword line WLj is read out on the bit line BLi, and the potential of the bit line BLi is changed. For example, as shown in FIG. 9, the potential of the bit line BLi is slightly changed downward from the Vcc/2 level.

Next, in each sense amplifier SA, one sense amplifier driving line SDN is pulled down to the ground potential Vss, and the other sense amplifier driving line SDP is pulled up to the power supply voltage Vcc, so that the amplifying transistors (TR6–TR9) are driven. Thereby, the potential information on the bit line pair is complementarily amplified to the H level (Vcc) and L level (Vss).

Next, one sense amplifier SA is selected from the sense amplifier banks 12 and 12 of each of two columns (one pair) by the Y address line driver YSD, and the bit BLi and the complementary bit line line BLi— are respectively connected to the local complementary data input and output line IO and data input and output line IO— via the sense amplifier SA selected and furthermore, connected to the main data input and output line MIO and complementary data input and output line MIO—.

Thus, when reading, the data read out on the bit line BLi is sent onto the data input and output line/complementary line (IO/IO—) and (MIO/MIO—) via said sense amplifier SA. When writing, the data from the data input and output line/complementary line (MIO/MIO—) and (IO/IO—) are written into an intended memory cell MCi,j via said sense amplifier SA and the bit line BLi.

After the memory accessing as mentioned above, the array controller 10 returns the equalizer timing signal φA to the H level. Thus, the P-type MOS transistor of the first equalizer control line driver 30 is electrified, and the N-type MOS transistor of the second equalizer control line driver 32 divided in the cross area 16 is blocked. Thus, each equalizer control line BELQ is driven (pulled up) to the H level of the power supply voltage VDD by the first equalizer control line driver 30, and the potential of the equalizer control signal φE is returned to the H level. At that time, since power is supplied to each equalizer control line BELQ from only one position (first equalizer control line driver 30), the rise rate of the equalizer control signal φE is considerably slower than the fall rate. Needless to say, since it is the equalizer return operation after finishing the memory access, the rise rate may be slow.

Also, a control line BELQB extending parallel with the equalizer control line BELQ is a signal line, and the delay time of the equalizer timing signal φA on the control line BELQB is very short (for example, about 0.2 nsec). Therefore, there is no problem of a feedthrough current between the first equalizer control line driver 30 (P-type MOS transistor) and the second equalizer control driver 32 (N-type MOS transistor).

Thus, in the DRAM of this application example, the equalizer control line BELQ shared with all of the sense amplifiers SA in the sense amplifier bank 12 of each row in each submat SM is connected to the first equalizer control line driver 30 consisting of the P-type MOS transistor installed at the left end (outside of the memory array part) of the submat SM and connected to the second equalizer control line driver 32 consisting of several N-type MOS transistors installed by being divided in the cross area 16 of each row through which the equalizer control line BLEQ passes.

In order to turn on the equalizer of the bit line pair BL and BL— connected to each sense amplifier SA, the first equalizer control line driver 30 is operated to drive the equalizer control line BLEQ to the H level potential (VDD). On the other hand, in order to turn off (disable) the equalizer of each bit line pair BL and BL— connected to each sense amplifier SA, the second equalizer control line driver 32 is operated to drive the equalizer control line BLEQ to the L level potential (Vss). The first equalizer control line driver 30 and the second equalizer control line driver 32 are complementarily operated, and when one of them is driven, the other is turned off (blocked).

In such a constitution, since several second equalizer control lines 32 are dispersed with respect to the equalizer control line BLEQ, these several second equalizer control line drivers 32 are driven by dividing or sharing the load capacity (wiring resistance, wiring capacity, transistor input gate capacity, etc.) of the equalizer control line BLEQ. Therefore, when the equalizer of each bit line pair is turned off, these several dispersed second equalizer control line drivers 32 discharge the equalizer control line BELQ at high speed to the ground voltage Vss, so that the potential of the equalizer control signal φE in each part on the equalizer control line BELQ can be rapidly lowered down to the L level (Vss).

Figure 7:
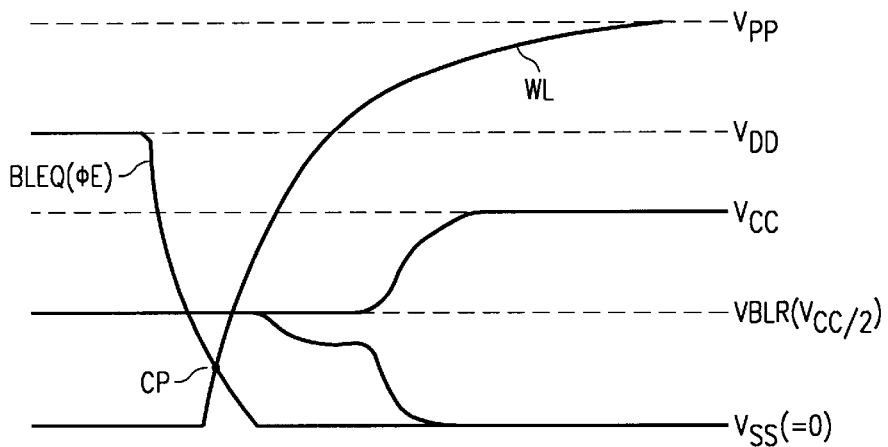
FIG. 7 shows a relationship between the fall in potential of the equalizer control lines and equalizer control signals and the rise in potential of the word lines in the DRAM of the application example.

Thus, although the activation timing of the word line WL is fast, as shown in FIG. 7, the cross point CP, at which the potential of the equalizer control line BLEQ (equalizer control signal φE) and the potential of the word line WL intersect, can be sufficiently lower than the threshold, so that sensing insufficient, memory cell data damage, etc., can be prevented. Therefore, the memory access speed can be improved.

Also, as the fall time of the equalizer control line φE is shortened, the operation speed of the transistors (TR3, TR4, and TR5) for precharging the sense amplifier SA or for controlling the equalizer is improved, and in these transistors, the conventional low-threshold type N channel structure with a relatively large size can also be changed into an ordinary threshold type N channel structure with a relatively small size. Thus, not only the layout area of the sense amplifier SA is reduced, but the input gate capacity of the equalizer control line BELQ is reduced, so that the transition of the equalizer control line φE is more accelerated.

Also, the arrangement pattern, in which several second equalizer control line drivers 32 are divided with respect to each equalizer control line BELQ, is not limited to the above-mentioned application example, and an optional arrangement pattern may be adopted. For example, the second equalizer control line drivers 32 may also be arranged by being divided in the cross area 12 of every other two instead of every other one or in all the cross areas 16. Or, the second equalizer control line drives 32 may also be arranged at the outside of the memory array part, for example, in the array controller 10.

Also, the number of the first equalizer control line driver 30 or its arrangement position can be optionally selected, and for example, it can also be arranged in the cross area 16.

Needless to say, in a semiconductor substrate, the cross area 16 is a P-type well enclosed with an N-type well of the sense amplifier bank 12 side and an N-type well of the subword line driver bank 14 side. If the N-type well for the first equalizer control line driver 30 (P-type MOS transistor) is installed in the P-type well, the separation among three kinds of N-type wells with different power supply voltages is required, so that the required area of the cross area 16 is considerably increased. Furthermore, the size of the submat SM is increased. This means, like the above-mentioned application example, the first equalizer control line driver 30 (P-type MOS transistor) is also preferably excluded from the cross area 16 in terms of design layout.

Also, the first equalizer control line driver 30 may be operated when the equalizer is returned, and the operation speed may not require an especially high speed. Therefore, the first equalizer control line driver 30 may also be arranged outside the memory array part without being divided in the cross area 16.

The memory array structure in the above-mentioned application example, in particular, the arrangement constitution of the bit lines, word lines, and memory cells in the unit memory arrays is an example, and various array structures can be adopted. The layout of the sense amplifier bank 12, subword line driver 14, and cross area 16 can also be variously modified, and an optional circuit constitution of various kinds of drivers can also be adopted. In particular, transistors other than the P-type MOS transistor can also be used in the first equalizer control line driver 30, and transistors other than the N-type MOS transistor can also be used in the second equalizer control line driver 32.

As explained above, according to the semiconductor memory device of the present invention, the driving means for driving the equalizer control lines for controlling the bit line equalizers are divided into the first driving circuit for turning on the equalizers and the second driving circuit for turning off the equalizers, and several second driving circuits are arranged by being divided with respect to the equalizer control lines. Thus, the required time for turning off the equalizers is greatly reduced, and a high-speed memory access time can be realized.

What is claimed is:

1. A semiconductor memory device comprising:

a plurality of memory arrays in which a plurality of sense amplifiers are connected to a respective pair of complementary bit lines in at least one of the memory arrays and are arranged adjacent to said at least one memory array; and in which an equalizer control line for controlling an equalizer for each bit line pair is commonly connected to the plurality of sense amplifiers over the at least one memory array, having a first driving circuit for driving the equalizer control line at a first voltage level and a second driving circuit for driving the equalizer control line at a second voltage level; the second driving circuit having a plurality of transistors electrically connected to the respective plurality of positions of the equalizer control line.

2. The semiconductor memory device of claim 1 wherein the plurality of sense amplifiers arranged adjacent to each memory array are arranged in prescribed bank regions and that the second driving circuit is installed between the mutually adjacent sense amplifier bank regions.

3. The semiconductor device of claim 2 wherein the first voltage level turns the equalizer on and the second voltage level turns the equalizer off.

4. The semiconductor memory device of claim 2, and wherein the first driving circuit has a first terminal connected to the equalizer control line, a second terminal connected to a power supply voltage terminal for providing the first potential level, a control terminal for receiving a binary signal which determines the voltage level of the equalizer control line, and a first transistor in which a conducting state is formed between the first and second terminals according to a first logic state of the binary signal and in which the first and second terminals are blocked according to a second logic state of the binary signal;

and wherein the second driving circuit having a first terminal connected to the equalizer control line, a second terminal connected to a power supply voltage terminal for providing the second potential level, a control terminal for receiving the binary signal, and a second transistor in which the first and second terminals are blocked according to the first logic state of the binary signal and in which a conducting state is formed between the first and second terminals are according to the second logic level of the binary signal.

5. The semiconductor device of claim 1 wherein the first voltage level turns the equalizer on and the second voltage level turns the equalizer off.

6. The semiconductor memory device of claim 1 wherein the first driving circuit has a first terminal connected to the equalizer control line, a second terminal connected to a power supply voltage terminal for providing the first potential level, a control terminal for receiving a binary signal which determines the voltage level of the equalizer control line, and a first transistor in which a conducting state is formed between the first and second terminals according to a first logic state of the binary signal and in which the first and second terminals are blocked according to a second logic state of the binary signal; and wherein the second driving circuit has a first terminal connected to the equalizer control line, a second terminal connected to a power supply voltage terminal for providing the second potential level, a control terminal for receiving the binary signal, and a second transistor in which the first and second terminals are blocked according to the first logic state of the binary signal and in which a conducting state is formed between the first and second terminals are according to the second logic level of the binary signal.

7. A semiconductor memory device comprising a plurality of memory arrays in which a plurality of sense amplifiers are connected to a respective pair of complementary bit lines in at least one of the memory arrays and are arranged adjacent to said at least one memory array, and in which an equalizer control line for controlling an equalizer for each bit line pair is commonly connected to the plurality of sense amplifiers over the at least one memory array, having a first driving circuit for driving the equalizer control line at a first voltage level to turn on the equalizer bit line pairs and a second driving circuit for driving the equalizer control line at a second voltage level to turn off the equalizer bit line pairs; the second driving circuit having a plurality of transistors electrically connected to the respective plurality of positions of the equalizer control line, wherein the first driving circuit has a first terminal connected to the equalizer control line, a second terminal connected to a power supply voltage terminal for providing the first potential level, a control terminal for receiving a binary signal which determines the voltage level of the equalizer control line, and a first transistor in which a conducting state is formed between the first and second terminals according to a first logic state of the binary signal and in which the first and second terminals are blocked according to a second logic state of the binary signal; and wherein the second driving circuit has a first terminal connected to the equalizer control line, a second terminal connected to a power supply voltage terminal for providing the second potential level, a control terminal for receiving the binary signal, and a second transistor in which the first and second terminals are blocked according to the first logic state of the binary signal and in which a conducting state is formed between the first and second terminals are according to the second logic level of the binary signal.

8. A semiconductor memory device comprising a plurality of memory arrays in which a plurality of sense amplifiers are connected to a respective pair of complementary bit lines in at least one of the memory arrays and are arranged adjacent to said at least one memory array, and in which an equalizer control line for controlling an equalizer for each bit line pair is commonly connected to the plurality of sense amplifiers over the at least one memory array, having a first driving circuit for driving the equalizer control line at a first voltage level to turn on the equalizer of the bit line pairs and a second driving circuit for driving the equalizer control line at a second voltage level to turn off the equalizer of the bit line pairs; the second driving circuit having a plurality of transistors electrically connected to the respective plurality of positions of the equalizer control line, wherein the plurality of sense amplifiers arranged adjacent to each memory array are arranged in prescribed bank regions and wherein the second driving circuit is installed between the mutually adjacent sense amplifier bank regions, and wherein the first driving circuit has a first terminal connected to the equalizer control line, a second terminal connected to a power supply voltage terminal for providing the first potential level, a control terminal for receiving a binary signal which determines the voltage level of the equalizer control line, and a first transistor in which a conducting state is formed between the first and second terminals according to a first logic state of the binary signal and in which the first and second terminals are blocked according to a second logic state of the binary signal; the second driving circuit having a first terminal connected to the equalizer control line, a second terminal connected to a power supply voltage terminal for providing the second potential level, a control terminal for receiving the binary signal, and a second transistor in which the first and second terminals are blocked according to the first logic state of the binary signal and in which a conducting state is formed between the first and second terminals are according to the second logic level of the binary signal.

* * * * *